(12) United States Patent
Valcore, Jr.

(10) Patent No.: US 9,043,525 B2
(45) Date of Patent: May 26, 2015

(54) OPTIMIZING A RATE OF TRANSFER OF DATA BETWEEN AN RF GENERATOR AND A HOST SYSTEM WITHIN A PLASMA TOOL

(71) Applicant: John C. Valcore, Jr., Berkeley, CA (US)

(72) Inventor: John C. Valcore, Jr., Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 284 days.

(21) Appl. No.: 13/715,942

(22) Filed: Dec. 14, 2012

(65) Prior Publication Data
US 2014/0173158 A1 Jun. 19, 2014

(51) Int. Cl.
*G06F 13/40* (2006.01)
*H01J 37/32* (2006.01)
*H05H 1/46* (2006.01)
*G06F 13/42* (2006.01)

(52) U.S. Cl.
CPC ........... *G06F 13/40* (2013.01); *H01J 37/32082* (2013.01); *H01J 37/32935* (2013.01); *H01J 37/32183* (2013.01); *H05H 2001/4682* (2013.01); *H05H 2001/4645* (2013.01); *H01J 37/32174* (2013.01); *G06F 13/4282* (2013.01)

(58) Field of Classification Search
CPC ..................... H01J 37/32082; H01J 37/32935; H01J 37/32183; H01J 37/32174; H05H 2001/4682; H05H 2001/4645; G06F 13/40; G06F 13/4282
USPC ......................................................... 710/305
See application file for complete search history.

(56) References Cited

U.S. PATENT DOCUMENTS

| | | |
|---|---|---|
| 4,454,001 A | 6/1984 | Sternheim et al. |
| 4,500,563 A | 2/1985 | Ellenberger et al. |
| 5,689,215 A | 11/1997 | Richardson et al. |
| 5,694,207 A | 12/1997 | Hung et al. |
| 5,788,801 A | 8/1998 | Barbee et al. |
| 5,866,985 A | 2/1999 | Coultas et al. |
| 5,889,252 A | 3/1999 | Williams et al. |
| 5,892,198 A | 4/1999 | Barnes et al. |
| 6,020,794 A | 2/2000 | Wilbur |

(Continued)

FOREIGN PATENT DOCUMENTS

JP 2005130198 5/2005

OTHER PUBLICATIONS

Singapore Search and Examination Report, issued in International Application No. 201309297-8, Hungarian Intellectual Property Office, Feb. 21, 2014.

(Continued)

*Primary Examiner* — Ryan Stiglic
(74) *Attorney, Agent, or Firm* — Martine Penilla Group, LLP

(57) ABSTRACT

A bus interconnect interfaces a host system to a radio frequency (RF) generator that is coupled to a plasma chamber. The bus interconnect includes a first set of host ports, which are used to provide a power component setting and a frequency component setting to the RF generator. The ports of the first set of host ports are used to receive distinct variables that change over time. The bus interconnect further includes a second set of generator ports used to send a power read back value and a frequency read back value to the host system. The bus interconnect includes a sampler circuit integrated with the host system. The sampler circuit is configured to sample signals at the ports of the first set at selected clock edges to capture operating state data of the plasma chamber and the RF generator.

23 Claims, 8 Drawing Sheets

(56) References Cited

U.S. PATENT DOCUMENTS

| | | | |
|---|---|---|---|
| 6,021,672 | A | 2/2000 | Lee |
| 6,042,686 | A | 3/2000 | Dible et al. |
| 6,048,435 | A | 4/2000 | DeOrnellas et al. |
| 6,110,214 | A | 8/2000 | Klimasauskas |
| 6,246,972 | B1 | 6/2001 | Klimasauskas |
| 6,417,732 | B1 * | 7/2002 | Radomski et al. ......... 330/207 P |
| 6,472,822 | B1 | 10/2002 | Chen et al. |
| 6,669,783 | B2 | 12/2003 | Sexton et al. |
| 6,750,711 | B2 | 6/2004 | Chawla et al. |
| 6,823,815 | B2 | 11/2004 | Han et al. |
| 6,826,456 | B1 * | 11/2004 | Irving et al. ................ 700/299 |
| 6,838,635 | B2 | 1/2005 | Hoffman et al. |
| 6,862,557 | B2 | 3/2005 | Jones et al. |
| 6,873,114 | B2 | 3/2005 | Avoyan et al. |
| 6,887,339 | B1 | 5/2005 | Goodman et al. |
| 6,972,524 | B1 | 12/2005 | Marakhtanov et al. |
| 6,983,215 | B2 | 1/2006 | Coumou et al. |
| 7,122,965 | B2 | 10/2006 | Goodman |
| 7,323,116 | B2 | 1/2008 | Guiney et al. |
| 7,435,926 | B2 | 10/2008 | Jafarian-Tehrani |
| 7,459,100 | B2 | 12/2008 | Kiemasz et al. |
| 7,480,571 | B2 | 1/2009 | Howald et al. |
| 7,602,127 | B2 * | 10/2009 | Coumou ................ 315/111.21 |
| 7,728,602 | B2 | 6/2010 | Valcore et al. |
| 7,858,898 | B2 | 12/2010 | Bailey, III et al. |
| 8,080,168 | B2 | 12/2011 | Cirigliano |
| 8,080,760 | B2 | 12/2011 | Dhindsa et al. |
| 8,110,991 | B2 * | 2/2012 | Coumou ................ 315/111.21 |
| 8,264,238 | B1 | 9/2012 | El-Chouelry |
| 8,271,121 | B2 | 9/2012 | Venugopal et al. |
| 8,314,561 | B2 * | 11/2012 | Fisk et al. ................ 315/111.21 |
| 8,404,598 | B2 | 3/2013 | Liao et al. |
| 8,796,593 | B2 * | 8/2014 | Okajima ...................... 219/490 |
| 2004/0060660 | A1 | 4/2004 | Klimecky et al. |
| 2004/0061448 | A1 | 4/2004 | Avoyan et al. |
| 2004/0222184 | A1 | 11/2004 | Hayami et al. |
| 2005/0090118 | A1 | 4/2005 | Shannon et al. |
| 2005/0119864 | A1 | 6/2005 | Coumou et al. |
| 2005/0133163 | A1 * | 6/2005 | Shannon et al. ......... 156/345.44 |
| 2005/0151479 | A1 | 7/2005 | Avoyan et al. |
| 2005/0217797 | A1 | 10/2005 | Jafarian-Tehrani |
| 2006/0065623 | A1 | 3/2006 | Guiney et al. |
| 2006/0065631 | A1 | 3/2006 | Cheng et al. |
| 2006/0065632 | A1 | 3/2006 | Cheng et al. |
| 2006/0232471 | A1 * | 10/2006 | Coumou ....................... 342/450 |
| 2006/0256499 | A1 * | 11/2006 | Yang et al. ................... 361/234 |
| 2007/0021935 | A1 | 1/2007 | Larson et al. |
| 2007/0080139 | A1 * | 4/2007 | Hoffman et al. ................. 216/59 |
| 2007/0080140 | A1 * | 4/2007 | Hoffman et al. ................. 216/59 |
| 2007/0095788 | A1 * | 5/2007 | Hoffman et al. ................. 216/59 |
| 2007/0262723 | A1 | 11/2007 | Ikenouchi |
| 2008/0227420 | A1 * | 9/2008 | Choueiry et al. .......... 455/226.1 |
| 2009/0167290 | A1 * | 7/2009 | Brouk et al. ................ 324/76.38 |
| 2009/0207537 | A1 | 8/2009 | Coumou |
| 2009/0294061 | A1 | 12/2009 | Shannon et al. |
| 2009/0295296 | A1 | 12/2009 | Shannon et al. |
| 2010/0099266 | A1 | 4/2010 | Oswald et al. |
| 2010/0270141 | A1 | 10/2010 | Carter et al. |
| 2010/0315064 | A1 | 12/2010 | Kuthi et al. |
| 2011/0115492 | A1 | 5/2011 | Valcore, Jr. et al. |
| 2011/0118863 | A1 | 5/2011 | Valcore, Jr. |
| 2011/0137446 | A1 | 6/2011 | Valcore, Jr. et al. |
| 2012/0000888 | A1 * | 1/2012 | Kawasaki et al. ................ 216/67 |
| 2012/0073754 | A1 | 3/2012 | De la Llera et al. |
| 2012/0103972 | A1 * | 5/2012 | Okajima ...................... 219/490 |

OTHER PUBLICATIONS

Thorsten, Lill et al, "Controlling Ion Energy Within a Plasma Chamber", U.S. Appl. No. 13/930,138, filed Jun. 28, 2013.

"Electromagnetic Waves and Antennas", Sophocles J. Orfanidis, Rutgers University, Aug. 25, 2013, Chapter 10.10.

Damon et al., "Synchronous Pulsed Plasma for Silicon Etch Applications", ECS Transactions, 27 (1) pp. 717-723 (2010), Publication by: The Electrochemical Society.

\* cited by examiner

OPTIMIZING A RATE OF TRANSFER OF DATA BETWEEN AN RF GENERATOR AND A HOST SYSTEM WITHIN A PLASMA TOOL

BACKGROUND

A master device and a slave device of a communication system follow protocols to communicate information with each other. For example, in an industry standard serial parallel interface (SPI), data is sent serially over a single wire from the master device to the slave device. As another example, a clock signal is communicated from the master device to the slave device.

However, the serial transmission of data has drawbacks, one of them being a low data rate. When one bit is transferred at a time over the wire, it takes a large amount of time to transfer information between the master device and the slave device.

SUMMARY

The present disclosure relates to improving a rate of transfer of data within a plasma system. It should be appreciated that the embodiments described in the present disclosure may be implemented in numerous ways, e.g., a process, an apparatus, a system, a device, a method on a computer-readable medium, etc. Various embodiments of the present disclosure are described below.

In some embodiments, a bus interconnect for interfacing a host system to a radio frequency (RF) generator that is coupled to a plasma chamber is provided. The bus interconnect includes a plurality of host ports. A first and a second port of the host system are used to provide a power component setting and a frequency component setting to the RF generator. Moreover, third, fourth, fifth, and sixth ports of the host system are used to receive four distinct variables that change over time. The bus interconnect further includes a plurality of generator ports. A first and a second port of the RF generator are used to send a power read back value and a frequency read back value to the host system. The bus interconnect includes a sampler circuit integrated with the host system. The sampler circuit is configured to sample signals at the third, fourth, fifth, and sixth ports of the host system at selected clock edges to capture operating state data of the plasma chamber and the RF generator.

In some embodiments, a bus interconnect for interfacing a host system to an RF generator that is coupled to a plasma chamber is provided. The bus interconnect includes a first set of host ports, which are used to provide a power component setting and a frequency component setting to the RF generator. The ports of the first set of host ports are used to receive distinct variables that change over time. The bus interconnect further includes a second set of generator ports used to send a power read back value and a frequency read back value to the host system. The bus interconnect includes a sampler circuit integrated with the host system. The sampler circuit is configured to sample signals at the ports of the first set at selected clock edges to capture operating state data of the plasma chamber and the RF generator.

In various embodiments, a plasma system is provided. The plasma system includes a host system for providing data signals. The plasma system further includes an RF generator coupled to the host system. The RF generator is used for generating an RF signal based on the data signals. The plasma system includes an impedance matching circuit for matching an impedance of the RF generator with an impedance of a plasma chamber. The plasma system also includes an RF transmission line coupling the impedance matching circuit the plasma chamber. The plasma system includes a bus interface connecting the host system to the RF generator. The bus interface includes a first set of host ports. The first set of host ports is used to provide a power component setting and a frequency component setting to the RF generator. The first set of host ports is used to receive distinct variables that change over time. The bus interconnect includes a second set of generator ports used to send a power read back value and a frequency read back value to the host system. The bus interconnect includes a sampler circuit integrated with the host system. The sampler circuit is used to sample signals at the ports of the first set at selected clock edges to capture operating state data of the plasma chamber and the RF generator.

In a variety of embodiments, a data rate transfer system is provided. The data rate transfer system includes multiple ports between a host system and an RF generator to allow transfer of data at rates higher than that allowed using a single wire. For example, a number, e.g., three, four, five, etc., of variables are transferred at a time, e.g., a second, a microsecond, etc., between the host system and an RF generator. The variables may include power, frequency, real portion of load impedance, and imaginary portion of the load impedance. As another example, the variables may include frequency, voltage magnitude, current magnitude, and phase between the voltage and current.

Also, in several embodiments, the number of variables transferred between the host system and the RF generator is limited, e.g., to three variables, five variables, six variables, etc. The limit in the number of variables reduces a number of communication channels between the host system and the RF generator. For example, the number of communication channels between the host system and the RF generator used to transfer the variables is less than 32, 64, 128, etc. The reduction in the number of communication channels reduces a number of ports on a parallel serial parallel interface (PSPI) of the host system that are connected to the communication channels and reduces a number of ports on a PSPI of the RF generator that are connected to the communication channels. The reduction in the number of ports and the number of communication channels reduces real estate on a chip, e.g., a chip including the host system, a chip including an RF controller of the RF generator, etc. Moreover, the reduction in the number of communication channels reduces noise in signals transferred on the communication channels and reduces chances of loss of signal integrity of the signals. There may not be a need to check for signal integrity when the signals are transferred over the limited number of communication channels. The number of variables allows to determine whether a plasma chamber is functioning properly, e.g., determining plasma unconfinement, arcing, etc.

Moreover, in some embodiments, there is less time spent in transferring the variables between the host system and the RF generator than that taken using packetization protocols, e.g., Ethernet protocols, Ethernet for Control Automation Technology (EtherCAT) protocols, etc. It should be noted that in various embodiments, the EtherCAT protocol is slower, e.g., has a lower frequency of operation, than a PSPI protocol applied by the PSPI. For example, data rate of EtherCAT is 1 kilohertz (kHz), which is less than a data rate applied by the PSPI protocol. As another example, a less number of data bits are transferred via EtherCAT ports than that transferred via ports of the PSPI. The packetization protocols are used to create data packets from data that is to be transferred between a master device and a slave device. The packetization may be limited based on a bandwidth of a network that is coupled to a packetization protocol interface, e.g., an Ethernet port, an EtherCAT port, etc. In several embodiments, there is no packetization performed in transferring the variables between the host system and the RF generator.

Also, in some embodiments, a statistical value, e.g., mean, median, mode, maximum, minimum, rolling variance, standard deviation, interquartile range (IQR), etc., is determined from the variables and the remaining values of the variables are deleted. For example, a mean of a variable over a time window is determined and values used to determine the mean are deleted from a storage device of the host system.

The determination of the statistical value and the deletion of the values saves memory space and provides feasibility in determining a fault within a plasma system. For example, when all the values are saved within the host system, on a cloud, etc., a number of the values is large and can be an impediment to transfer of the values between network devices, etc. When statistical values are saved in one or more storage devices of the host system, the statistical values occupy less memory space than that occupied by all the values. Also, it is easier to transfer the statistical values over a network, e.g., the Internet, an Intranet, etc., compared to transferring all the values. Lesser bandwidth of the network is used when the statistical values are transferred than that used when all the values are transferred.

Some advantages of the above-described embodiments include the transfer of data between the host system and the RF generator faster than that provided by the serial communication of the single wire, the savings in real estate on a semiconductor chip, the removal of need to check signal for integrity, and the transfer of the data without a need to use the packetization protocols.

Other aspects will become apparent from the following detailed description, taken in conjunction with the accompanying drawings.

BRIEF DESCRIPTION OF THE DRAWINGS

Various embodiments of the present disclosure may best be understood by reference to the following description taken in conjunction with the accompanying drawings.

DETAILED DESCRIPTION

The following embodiments describe systems and methods for improving a rate of transfer of data.

Figure 1:
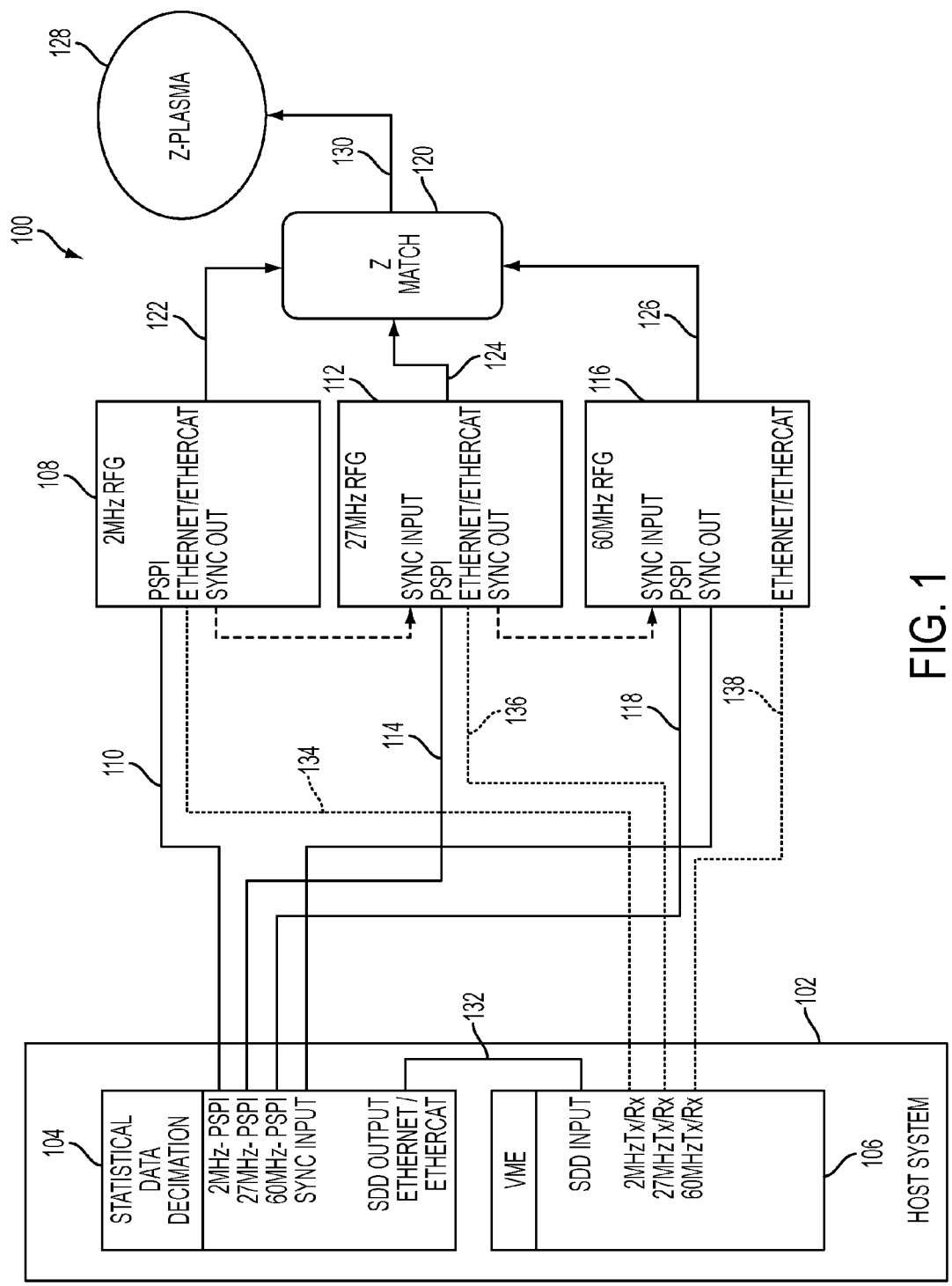
FIG. 1 is a block diagram of a system for improving a rate of transfer of data, in accordance with various embodiments of the present disclosure.

FIG. 1 is a block diagram of a system 100 for improving a rate of transfer of data, in accordance with several embodiments described in the present disclosure. A host system 102 includes a statistical data decimation (SDD) module and a VME module 106. As used herein, a host system includes a controller, which includes one or more processors and one or more storage devices. In various embodiments, the operations described herein as performed by a controller are performed by one or more processors of the controller.

As used herein, a processor may be a central processing unit (CPU), a microprocessor, an application specific integrated circuit (ASIC), a programmable logic device (PLD), etc. Examples of the storage device include a read-only memory (ROM), a random access memory (RAM), or a combination thereof. The storage device may be a flash memory, a redundant array of storage disks (RAID), a hard disk, etc.

A module, as used herein, includes hardware, software, or a combination thereof. For example, a module is implemented as an integrated circuit, e.g., a field programmable gate array (FPGA), an ASIC, etc., which processes data. As another example, a module is a computer software program that is executed by a microprocessor. As another example, a portion of a module is implemented as an integrated circuit and another portion of the module is executed by a microprocessor.

The SDD module 104 includes a 2 MHz parallel serial parallel interface (PSPI), which is an interface that is connected to a PSPI of a 2 MHz radio frequency (RF) generator 108 via a communication link 110, e.g., a cable. The SDD module 104 further includes a 27 MHz PSPI, which is connected to a PSPI of a 27 MHz RF generator 112 via a communication link 114, e.g., a cable. Moreover, the SDD module 104 includes a 60 MHz PSPI, which is connected to a PSPI of a 60 MHz RF generator 116 via a communication link 118, e.g., a cable. A cable that connects one PSPI to another PSPI may communicate signals using a protocol, e.g., an RS-232 protocol, a Universal Serial Bus (USB) protocol, etc.

The RF generators 108, 112, and 116 are connected to an impedance (Z) matching circuit 120. For example, the RF generator 108 is connected to the impedance matching circuit 120 via a communication medium 122, e.g., cable, etc., the RF generator 112 is connected to the impedance matching circuit 120 via a communication medium 124, and the RF generator 116 is connected to the impedance matching circuit 120 via a communication medium 126.

In some embodiments, an impedance matching circuit matches an impedance of a load connected to the impedance matching circuit with an impedance of a source, also connected to the impedance matching circuit. For example, the impedance matching circuit 120 matches an impedance of a plasma chamber 128 that is connected to the impedance matching circuit 120 via an RF transmission line 130 with impedances of the RF generators 108, 112, and 116. In several embodiments, the impedance matching circuit 120 includes electrical components, e.g., capacitors, inductors, etc., to match impedances. In various embodiments, an RF transmission line includes an RF tunnel that is connected to an RF strap, which is connected to an RF rod.

The PSPIs of the SDD module 104 sends power set points, e.g., power, etc., and frequency set points, frequencies, etc., to the PSPIs of the RF generators 108, 112, and 116 via the links 110, 114, and 118. For example, the 2 MHz PSPI of the SDD module 104 sends a power set point and a frequency set point via the link 110 to the PSPI of the RF generator 108, the 27 MHz PSPI of the SDD module 104 sends a power set point and a frequency set point via the link 114 to the PSPI of the RF generator 112, and the 60 MHz PSPI of the SD module 104 sends a power set point and a frequency set point via the link 118 to the PSPI of the RF generator 116.

A digital signal processor (DSP) of an RF generator receives a power set point and provides the power set point to a driver, e.g., one or more transistors, etc., of the RF generator. The driver generates an RF signal having power indicated within the power set point. An amplifier coupled with the driver amplifies the RF signal and provides the amplified RF signal to the impedance matching circuit 120. The impedance matching circuit 120 sends the amplified RF signal having the power via the RF transmission line 130 to the plasma chamber 128.

Similarly, the DSP of the RF generator receives a frequency set point and provides the frequency set point to the driver of the RF generator. The driver generates an RF signal having a frequency indicated within the frequency set point. An amplifier coupled with the driver amplifies the RF signal and provides the amplified RF signal to the impedance matching circuit 120. The impedance matching circuit 120 sends the amplified RF signal having the frequency via the RF transmission line 130 to the plasma chamber 128.

The plasma chamber 128 includes an electrostatic chuck (ESC), an upper electrode, and other parts (not shown), e.g., an upper dielectric ring surrounding the upper electrode, an upper electrode extension surrounding the upper dielectric ring, a lower dielectric ring surrounding a lower electrode of the ESC, a lower electrode extension surrounding the lower dielectric ring, an upper plasma exclusion zone (PEZ) ring, a lower PEZ ring, etc. The upper electrode is located opposite to and facing the ESC. The ESC includes the lower electrode. A work piece, e.g., a semiconductor wafer, etc., is supported on an upper surface of the ESC. Integrated circuits, e.g., application specific integrated circuit (ASIC), programmable logic device (PLD), etc. are developed on the work piece and the integrated circuits are used in a variety of electronic items, e.g., cell phones, tablets, smart phones, computers, laptops, networking equipment, etc. Each of the upper and lower electrodes is made of a metal, e.g., aluminum, alloy of aluminum, copper, etc.

In one embodiment, the upper electrode includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode is grounded. The ESC is coupled to the RF generators 108, 112, and 116 via the impedance matching circuit 120.

When the process gas is supplied between the upper electrode and the ESC and when the RF generator 108, 112, and/or 116 supplies RF signals via the impedance matching circuit 120 to the lower electrode of the ESC, the process gas is ignited to generate plasma within the plasma chamber 128.

A sensor within an RF generator measures variables, e.g., forward power, reflected power, complex voltage, complex current, etc., based on RF signals transferred over a communication medium, e.g., the communication medium 122, 124, 126, etc., that is connected to the sensor. For example, a sensor of the RF generator 108 measures a complex voltage and complex current based on RF signals transferred over the communication medium 122 between the RF generator 108 and the impedance matching circuit 120.

A DSP within an RF generator may determine, e.g., calculates, computes, etc., other variables, e.g., delivered power, complex voltage and current (complex V&I), gamma, load impedance, etc., based on variables measured by a sensor of the generator. For example, a DSP of the RF generator 108 calculates a complex V&I based on the complex voltage and the complex current. A complex V&I includes a voltage magnitude, which is the same as that of the complex voltage, a current magnitude, which is the same as that of the complex current, and a phase, which is a phase difference between a phase of the complex voltage and a phase of the complex current.

In some embodiments, the variables calculated by a DSP of an RF generator or measured by a sensor of the generator are transferred via a corresponding link to a PSPI of the SDD module 104. For example, the variables calculated by a DSP of the RF generator 108 or measured by a sensor of the RF generator 108 are transferred from the PSPI of the RF generator 108 via the link 110 to the 2 MHz PSPI of the SDD module 104.

In various embodiments, a transistor-transistor (TTL) signal is provided from a Sync OUT port of the RF generator 108 to a Sync INPUT port of the RF generator 112 to synchronize operation, e.g., to change a state of an RF signal, etc., of the RF generator 112 with the RF generator 108. In some embodiments, the TTL signal is provided from a Sync OUT port of the RF generator 112 to a Sync INPUT port of the RF generator 116 to synchronize operation of the RF generators 112 and 116. Also, in several embodiments, the TTL signal is provided from a Sync OUT port of the RF generator 116 to a Sync INPUT port of the SDD module 104 to inform the SDD module 104 of a state, e.g., high state, low state, high power state, low power state, etc., of RF signals generated by the RF generators 108, 112, and 116. It should be noted that the high state or the high power state is a state of an RF signal that has a higher power magnitude than that of the low state or the low power state. In several embodiments, an RF signal switches between the high state and the low state.

In some embodiments, data, e.g., variables, etc., generated within the SDD module 104, stored within the SDD module 104, and/or received by a PSPI of the SDD module 104 from a PSPI of an RF generator is provided from an SDD Output of the SDD module 104 via a connection 132, e.g., an Ethernet connection, an EtherCAT connection, a USB connection, a serial connection, a parallel connection, etc., to an SDD Input of the VME module 106. Data received via the SDD Input may be stored within the VME module 106.

In several embodiments, a 2 MHz Transmit/Receive (Tx/Rx) port of the VME module 106 is used to transmit set points other than power and frequency, e.g., a temperature set point, etc., via a connection 134, e.g., an Ethernet connection, an EtherCAT connection, a USB connection, a serial connection, a parallel connection, etc., to a port, e.g., Ethernet port, EtherCAT port, etc., of the RF generator 108. Moreover, a 27 MHz Transmit/Receive (Tx/Rx) port of the VME module 106 is used to transmit set points other than power and frequency via a connection 136 to a port, e.g., Ethernet port, EtherCAT port, etc., of the RF generator 112. Also, a 60 MHz Transmit/Receive (Tx/Rx) port of the VME module 106 is used to transmit set points other than power and frequency via a connection 138 to a port, e.g., Ethernet port, EtherCAT port, etc., of the RF generator 116. In some embodiments, the Tx/Rx ports of the VME module 106 send data, e.g., variables, etc., received from the SDD module 104 to ports, e.g., Ethernet port, EtherCAT ports, etc., of the RF generators 108, 112, and 116. In various embodiments, the connections 134, 136, and 138 facilitate reception of data by the VME module 106 from the RF generators 108, 112, and 116.

It should be noted that although the above-described embodiments are described with respect to the 2 MHz, 27 MHz, and 60 MHz generators, in some embodiments, any other frequencies are used. For example, instead of 2 MHz, a 4 MHz generator is used.

It should further be noted that any number of RF generators may be used. For example, instead of three RF generators, one or two RF generators may be used.

Figure 2A:
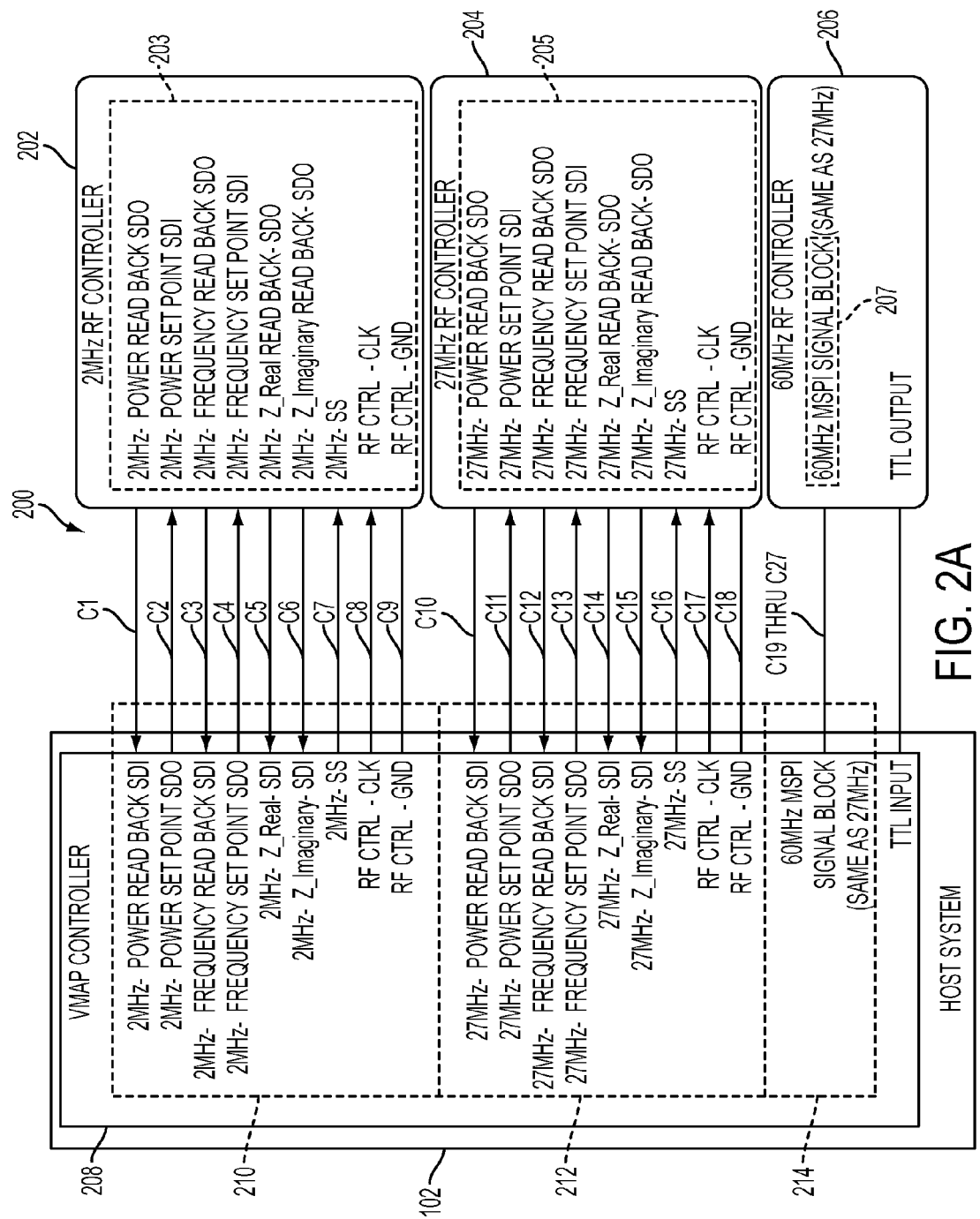
FIG. 2A is a block diagram of a system for improving a rate of transfer of data between a host system of the system of FIG. 1 and radio frequency (RF) generators of the system of FIG. 1, in accordance with several embodiments of the present disclosure.

FIG. 2A is a block diagram of an embodiment of a system 200 for improving a rate of transfer of data between the host system 102 and the RF generators 108, 112, and 116 (FIG. 1).

An RF generator includes a controller. For example, the RF generator 108 includes a controller 202, which includes a PSPI 203. Moreover, the RF generator 112 includes a controller 204, which includes a PSPI 205. The RF generator 116 includes a controller 206, which includes a PSPI 207.

The host system 102 includes a virtual methodology for advanced process control (VMAP) controller 208. The VMAP controller 208 includes a PSPI 210, which is an example of the 2 MHz PSPI of the SDD 104 (FIG. 1). The VMAP controller 208 includes a PSPI 212, which is an example of the 27 MHz PSPI of the SDD 104 and the VMAP controller 208 includes a PSPI 214, which is an example of the 60 MHz PSPI of the SDD 104.

A 2 MHz power set point serial data output (SDO) port of the PSPI 210 sends a power set point serially via a communication channel C2 to a 2 MHz power set point serial data input (SDI) port of the PSPI 203. Examples of a communication channel include one or more wires, etc, that follow a protocol, e.g., a serial protocol, a differential protocol, etc. For example, in case of differential signals, a communication channel includes two wires. When differential signaling is used, pin count of data ports, e.g., set point ports, read back ports, etc., used to transfer data signals, e.g., set points, read back data, variables, etc., increases, e.g., doubles, compared to when differential signaling is not used and noise immunity of the data signals is improved. Otherwise, in this example, a communication channel includes one wire. Moreover, in some embodiments, a 2 MHz frequency set point SDO port of the PSPI 210 sends a frequency set point serially via a communication channel C4 to a 2 MHz frequency set point SDI port of the PSPI 203.

Furthermore, a power read back SDO port of the PSPI 203 sends a power reading, e.g., forward power measured by a sensor of the RF generator 108 (FIG. 1), reflected power measured by a sensor of the RF generator 108, delivered power determined by a DSP of the RF generator 108, etc., via a communication channel C1 to a power read back SDI port of the PSPI 210. It should be noted that delivered power is a difference between forward power and reflected power. It should be noted that in some embodiments, forward power includes RF power supplied by an RF generator to the plasma chamber 128 (FIG. 1) and reflected power includes RF power reflected back from the plasma chambers 128 towards the RF generator.

Moreover, in various embodiments, a frequency read back SDO port of the PSPI 203 sends a frequency reading, e.g., frequency of forward power measured by a sensor of the RF generator 108 (FIG. 1), frequency of reflected power measured by a sensor of the RF generator 108, frequency of delivered power determined by a DSP of the RF generator 108, etc., via a communication channel C3 to a frequency read back SDI port of the PSPI 210.

Also, in several embodiments, a real impedance read back SDO port of the PSPI 203 sends a real portion, e.g., resistance, etc., of load impedance of a load via a communication channel C5 to a 2 MHz real impedance SDI port of the PSPI 210. Examples of a load include one or more communication mediums 122, 124, and 126, the impedance matching circuit 120, the RF transmission line 130, the plasma chamber 128, or a combination thereof. In various embodiments, an imaginary impedance read back SDO port of the PSPI 203 sends an imaginary portion, e.g., reactance, etc., of load impedance via a communication channel C6 to a 2 MHz imaginary impedance SDI port of the PSPI 210.

The PSPI 210 sends a slave select (SS) signal from a 2 MHz SS port via a communication channel C7 to a 2 MHz SS port of the PSPI 203 to select a semiconductor chip on which the RF controller 202 and the PSPI 203 are implemented. An SS signal determines which of the PSPIs 203, 205, and/or 207 listen to, e.g., reads, etc., data from the VMAP controller 208 and/or send data to the VMAP controller 208. For example, to select the PSPI 203, an SS signal is sent via the communication channel C7. When the PSPI 203 is selected, a set point may be sent to the PSPI 203 and/or read back from the PSPI 203 is performed. As another example, to select a semiconductor chip on which the RF controller 204 and the PSPI 205 are implemented, an SS signal is sent via a communication channel C16 from a 27 MHz SS port of the PSPI 212 to a 27 MHz SS port of the PSPI 205. Moreover, to select a semiconductor chip on which the RF controller 206 and the PSPI 207 are implemented, an SS signal is sent via a communication channel C25 from a 60 MHz SS port of the PSPI 214 to a 60 MHz SS port of the PSPI 207.

A clock signal is sent from an RF Control (Ctrl)-CLK port of the PSPI 210 via a communication channel C8 to an RF Ctrl-CLK port of the PSPI 203. Also, a ground signal, e.g., a reference signal, a zero voltage signal, etc., is communicated between an RF Ctrl-Ground (GND) port of the PSPI 210 and an RF Ctrl-GND port of the PSPI 203. The ground signal establishes a reference for all signals, except for a clock signal, communicated between the VMAP controller 208 and the PSPIs 203, 205, and 207.

Similarly, signals similar to that communicated between the PSPI 210 and the PSPI 203 are communicated between the PSPI 212 and the PSPI 205 via communication channels C10 thru C18. Moreover, signals similar to that communicated between the PSPI 210 and the PSPI 203 are communicated between the PSPI 214 and the PSPI 207 via communication channels C19 thru C27. In several embodiments, the communication channels C1 thru C9 are included within a cable, e.g., an RS-232 cable, etc., the communication channels C10 thru C18 are included within another cable, e.g., an RS-232 cable, etc., and the communication channels C19 thru C27 are includes within yet another cable, e.g., an RS-232 cable, etc.

Moreover, a TTL signal is sent from a TTL Output port of the RF controller 206 to a TTL input port of the VMAP controller 208. It should be noted that the TTL Output port of the RF controller 206 is the same as the Sync OUT port of the 60 MHz RF generator 116 (FIG. 1) and the TTL Input port of the PSPI 210 is the same as the Sync INPUT port of the SDD 104 (FIG. 1).

In various embodiments, communication between the PSPIs 210, 212, and the 214 of the host system 102 and the PSPIs 203, 205, and 207 of the RF controllers 202, 204, and 206 is point-to-point. For example, the PSPI 210 is not connected to the PSPI 203 via a network, e.g., the Internet, an Intranet, etc., that includes network devices, e.g. routers, switches, bridges, etc. As another example, the PSPI 212 is not connected to the PSPI 205 via a network and the PSPI 214 is not connected to the PSPI 207 via a network. The point-to-point communication reduces one or more lengths of communication channels C1 thru C27 between the host system 102 and the RF generators 202, 204, and 206 compared to a length of a cable network used in a network.

In some embodiments, there is no packetization, e.g., generating Ethernet packets, generating EtherCAT packets, etc., performed by a PSPI. In various embodiments, less than 32 parallel channels are used to transfer data signals between a PSPI of the VMAP controller 208 and a PSPI of an RF generator controller. For example, less than 32 parallel channels are used to transfer a power read back signal, a power set point signal, a frequency read back signal, a frequency set point signal, a real impedance signal, and an imaginary impedance signal, between the PSPI 210 and the PSPI 203.

In some embodiments, a PSPI of an RF controller is implemented on a chip separate from a chip on which a PSPI of another RF controller is implemented. For example, the PSPI 203 is implemented within a semiconductor chip, the PSPI 205 is implemented within another semiconductor chip, and the PSPI 207 is implemented within yet another semiconductor chip. In several embodiments, the VMAP controller 208 is implemented within a single semiconductor chip or within multiple semiconductor chips. For example, the PSPI 210 is implemented within a semiconductor chip, the PSPI 212 is implemented within another semiconductor chip, and the PSPI 214 is implemented within yet another semiconductor chip.

In various embodiments, a read back of a variable is performed synchronous with, e.g., simultaneous with, etc., a transfer of a set point. For example, a read back of power is performed via the communication channel C1 synchronous with sending a power set point via the communication channel C2. As another example, a read back of frequency is performed via the communication channel C3 synchronous with sending a power set point via the communication channel C2 and/or with sending a frequency set point via the communication channel C4. As yet another example, signals of variables transferred via the channels C1, C3, C5, and C6 and signals of set points transferred via the channels C2 and C4 are transferred, e.g., read, sent, etc., synchronous with a clock signal sent via the communication channel C8.

In some embodiments, a read back signal, e.g., power read back signal, frequency read back signal, real portion of load impedance read back signal, imaginary portion of load impedance read back signal, etc. is an example of a data signal. Moreover, a set point signal, e.g., a frequency set point signal, a power set point signal, etc., is an example of a data signal. Also, a slave select signal is an example of a control signal.

In various embodiments, the host system 102 is implemented within one or more integrated circuits, e.g., an FPGA, an ASIC, etc. Moreover, in some embodiments, one or more of the RF controllers 202, 204, and 206 are implemented within one or more integrated circuits.

In some embodiments, transfer of variables of all RF generators is synchronized, e.g., performed simultaneous with, performed at a clock edge, etc., with a clock signal. For example, the variables transferred over the channels C1, C3, C5, C6, C10, C12, C14, C15. C19, C21, C23, and C24 are synchronized with a clock signal sent from the RF Ctrl-CLK port of the PSPI 210. As another example, the clock signals sent from the RF Ctrl-CLK ports of the PSPIs 210, 212, and 214 are synchronized with each other and also with the variables transferred over the channels C1, C3, C5, C6, C10, C12, C14, C15. C19, C21, C23, and C24. As another example, the variables transferred over the channels C1, C3, C5, C6, C10, C12, C14, C15, C19, C21, C23, and C24 and set points of variables transferred over the channels C2, C4, C11, C13, C20, and C22 are synchronized with a clock signal sent from the RF Ctrl-CLK port of the PSPI 210. As another example, the clock signals sent from the RF Ctrl-CLK ports of the PSPIs 210, 212, and 214 are synchronized with each other and also with the variables transferred over the channels C1, C2, C3, C4, C5, C6, C9, C10, C11, C12, C13, C14, C15, C19, C20, C21, C22, C23, and C24.

In various embodiments, a PSPI of the VMAP controller 208 operates in set point only mode or in read back only mode. For example, when the 2 MHz power set point SDO port and the 2 MHz frequency set point SDO port of the PSPI 210 are configured to send set points, the 2 MHz power read back SDI, the 2 MHz frequency read back SDI, the 2 MHz real impedance SDI port, and the 2 MHz imaginary impedance SDI port of the PSPI 210 are not configured to read back variables from the PSPI 203. As another example, when the 2 MHz power read back SDI, the 2 MHz frequency read back SDI, the 2 MHz real impedance SDI port, and the 2 MHz imaginary impedance SDI port of the PSPI 210 are configured to read back variables from the PSPI 203, the 2 MHz power set point SDO port and the 2 MHz frequency set point SDO port of the PSPI 210 are not configured to send set points to the PSPI 203.

In some embodiments, a PSPI of an RF controller, e.g., the RF controller 202, the RF controller 204, the RF controller 206, etc., operates in set point only mode or in read back only mode. For example, when the 2 MHz power set point SDI port and the 2 MHz frequency set point SDI port of the PSPI 203 are configured to read, e.g., receive, access, etc., set points, the 2 MHz power read back SDO, the 2 MHz frequency read back SDO, the 2 MHz real impedance SDO port, and the 2 MHz imaginary impedance SDO port of the PSPI 203 are not configured to send variables to the PSPI 210. As another example, when the 2 MHz power read back SDO, the 2 MHz frequency read back SDO, the 2 MHz real impedance SDO port, and the 2 MHz imaginary impedance SDO port of the PSPI 203 are configured to send variables to the PSPI 210, the 2 MHz power set point SDI port and the 2 MHz frequency set point SDI port of the PSPI 203 are not configured to receive set points from the PSPI 210.

In various embodiments, a PSPI of the host system 102, e.g., the PSPI 210, 212, 214, etc., is configured to operate at a data rate that a PSPI of an RF generator coupled to the host system 102 supports. For example, when the RF controller 202 is implemented on a fast FPGA, the RF Ctrl-CLK port of the PSPI 210 is configured to operate at a frequency of greater than or equal to 1 megahertz (MHz) to send a clock signal to the RF controller 202. In this example, when instead of the RF controller 202, another RF controller (not shown) is implemented on a slow FGPA, the RF Ctrl-CLK port of the PSPI 210 is configured to operate at a frequency less than 1 MHz to send a clock signal to the other RF controller. It should be noted that 1 MHz is an example and the frequency is not limited to 1 MHz. For example, instead of 1 MHz, another frequency, e.g., 2 MHz, 3 MHz, etc., may be used to illustrate the difference between fast and slow FPGAs.

Figure 2B:
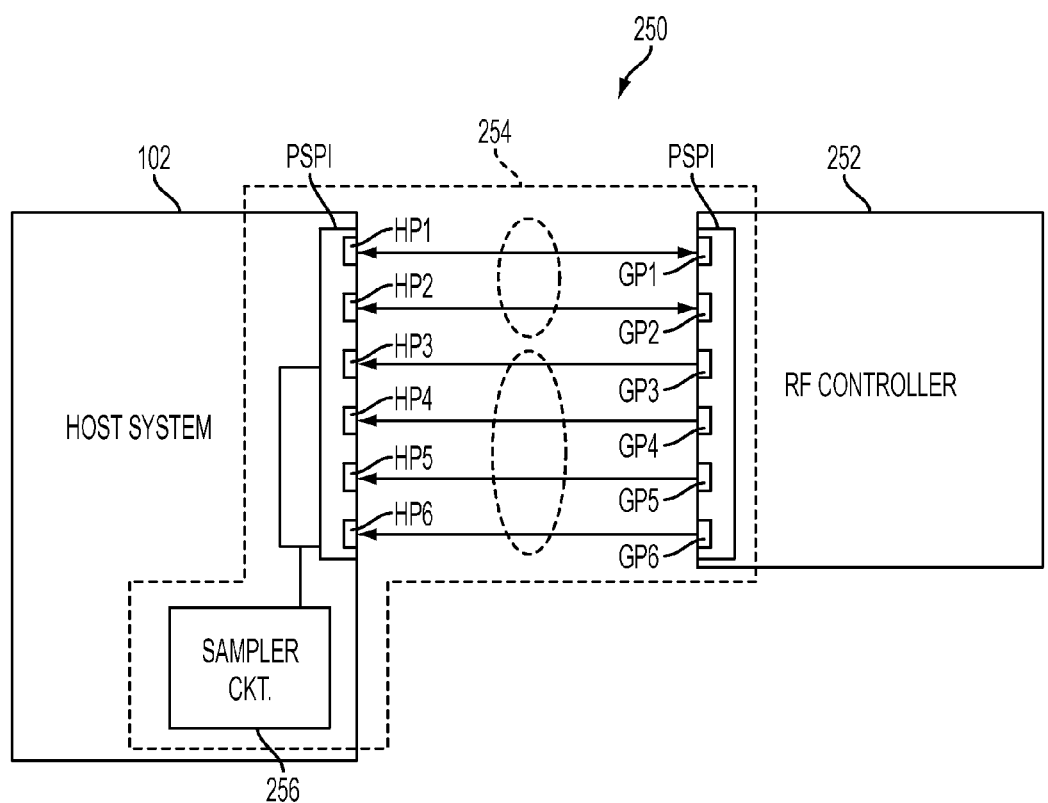
FIG. 2B is a block diagram of an embodiment of a system for improving a rate of transfer of data between the host system and the RF generators, in accordance with several embodiments of the present disclosure.

FIG. 2B is a block diagram of an embodiment of a system 250 for improving a rate of transfer of data between the host system 102 and an RF controller 252, which is an example of the RF controller 202, the RF controller 204, or the RF controller 206 (FIG. 2A). The system 250 includes the host system 102, the RF controller 252 and a bus interconnect 254.

The bus interconnect 254 interfaces, e.g., provides one or more communication channels, provides a communication protocol, etc., between the host system 102 and the RF controller 252. The bus interconnect 254 includes a PSPI, which includes multiple host ports HP1 thru HP6, that is fitted within the host system 102. Moreover, the bus interconnect 254 includes a PSPI, which includes multiple generator ports GP1 thru GP6, that is fitted within the RF controller 252.

It should be noted that although six ports are shown, in some embodiments, the RF controller 252 or the host system 102 includes any number, e.g., nine, ten, eight, etc., of ports. For example, the PSPI fitted within the host system 102 includes a port HP7 that sends a slave select signal to select the PSPI fitted within the RF controller 252 for enabling providing data, e.g., power set point, frequency set point, etc., to the PSPI fitted within the RF controller 252 or enabling read back of data, e.g., the variables VR1 thru VR4, etc., from the PSPI fitted within the RF controller 252. As another example, the PSPI of the host system 102 includes a port HP8 that sends a clock signal to the PSPI fitted within the RF controller 252. As yet another example, the PSPI of the host system 102 includes a port HP9 that sends a ground signal to or receives the ground signal from the PSPI fitted within the RF controller 252. As another example, the PSPI fitted within the RF controller 252 includes a port GP7 that receives the slave select signal from the port HP7 to initiate sending data to the PSPI fitted within the host system 102 or to initiate receiving data from the PSPI fitted within the host system 102. As another example, the PSPI fitted within the RF controller 252 includes a port GP8 that receives the clock signal from the PSPI fitted within the host system 102. As yet another example, the PSPI fitted within the RF controller 252 includes a port GP9 that sends a ground signal to or receives the ground signal from the PSPI fitted within the host system 102.

In some embodiments, the port HP1 is a power set point serial data out port, the port HP2 is a frequency set point serial data out port, the port HP3 is a power read back serial data in port, the port HP4 is a frequency read back serial data in port, the port HP5 is a real portion of load impedance serial data in port, the port HP6 is an imaginary portion of load impedance serial data in port, the port HP7 is a slave select signal port, the port HP8 is a clock signal port, and the port HP9 is a ground signal port.

In various embodiments, the port GP1 is a power set point serial data in port, the port GP2 is a frequency set point serial data in port, the port GP3 is a power read back serial data out port, the port GP4 is a frequency read back serial data out port, the port GP5 is a real portion of load impedance serial data out port, the port GP6 is an imaginary portion of load impedance serial data out port, the port GP7 is a slave select signal port, the port GP8 is a clock signal port, and the port GP9 is a ground signal port.

The port HP1 sends a power component setting, e.g., a power magnitude, etc., to the port GP1. Moreover, the port HP2 sends a frequency component setting, e.g., a frequency, etc., to the port GP2. Moreover, the ports HP2 thru HP6 receive, e.g., read back, access, etc., four distinct variables, VR1 thru VR4, that change over time. For example, complex load impedance, complex V&I, complex voltage, complex current, complex power, complex gamma, etc., have a positive frequency. As another example, in practicality, frequency is not a constant. For example, a frequency has a standard deviation, a variance, etc., that changes the frequency over time. In some embodiments, a frequency is maintained constant.

The port GP3 sends a power read back value, e.g., a power magnitude, etc., to the port HP3. Moreover, the port GP4 sends a frequency read back value, e.g., a frequency, etc., to the host system 102.

The PSPI of the host system 102 includes a sampler circuit 256. The sampler circuit 256 is integrated with the host system 102, e.g., is configured within an integrated circuit of the host system 102. In several embodiments, each port that samples a signal includes a sampler circuit. For example, the port HP3 includes a sampler circuit, the port HP4 includes a sampler circuit, the port HP5 includes a sampler circuit, and the port HP6 includes a sampler circuit, the port GP1 includes a sampler circuit, and the port GP2 includes a sampler circuit.

The sampler circuit 256 samples signals received, e.g., the variables VR1 thru VR4, etc., at the ports HP3 thru HP6 at selected clock edges, e.g., rising clock edges, falling clock edges, etc. The sampler circuit 256 samples the signals to capture operating state data, e.g., frequency, load impedance, the variables V1 thru V4, complex voltage, complex current, complex V&I, of the plasma chamber 128 (FIG. 1) and of the RF generator 108, 112, and/or 116 (FIG. 1), The operating state data of the plasma chamber 128 is detected, e.g., measured, sensed, etc., by a sensor, e.g., a voltage and current sensor, a voltage sensor, a current sensor, a power sensor, etc., of an RF generator that includes the RF generator controller 252. In some embodiments, the operating state data, e.g., complex gamma, complex delivered power, etc., of the plasma chamber 128 is determined by a DSP of the RF generator that includes the RF controller 252. In various embodiments, the operating state data of an RF generator includes frequency, power, etc., set by the RF generator. It should be noted that the host system 102 provides a set point, e.g., a frequency set point, a power set point, etc. to an RF generator. When the RF generator receives a set point, the RF generator sets power and/or frequency based on the set point. For example, the RF generator looks up a set point in a storage device of the RF generator to determine an associated, e.g., linked, etc., drive power and/or frequency with the set point. The set power and/or frequency, e.g., the drive power and/or frequency, etc., is provided to a drive of the RF generator to generate an RF signal having the power and/or frequency.

In embodiments in which five variables are transferred over communication channels between the host system 102 and the RF controller 252, an example of the five variables include frequency, complex forward power, and complex reflected power. Complex power includes a magnitude of power and a phase of power. Another example of the five variables include frequency, complex voltage, and complex current. A complex voltage includes a voltage magnitude and a voltage phase. A complex current includes a current magnitude and a current phase. In these embodiments, five communication channels are used between a PSPI of the host system 102 and a PSPI of the RF controller 252 to read back five variables from the PSPI of the RF controller 252.

Figure 3A:
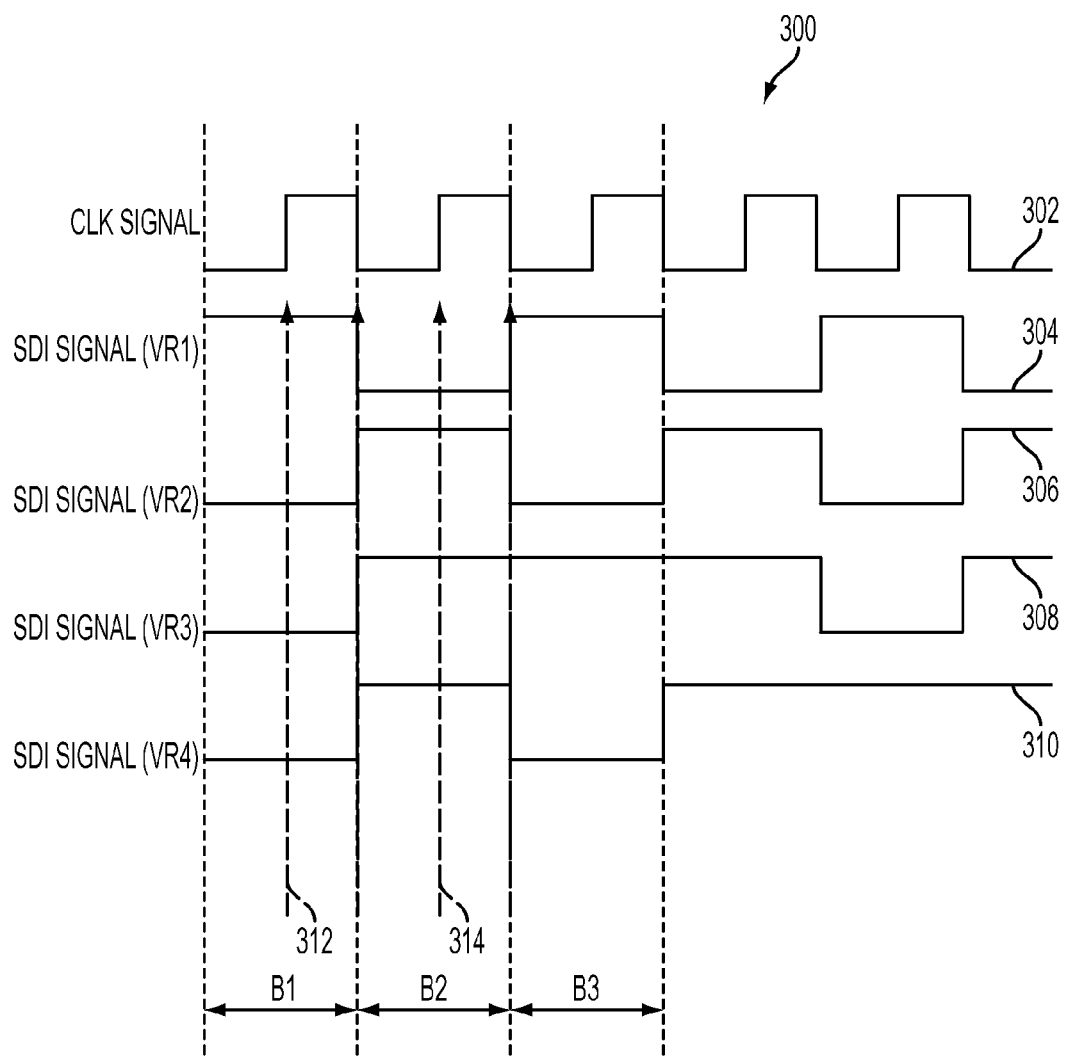
FIG. 3A is a timing diagram for illustrating a sampling of variables in synchronization with a clock signal of the system of FIG. 2A, in accordance with some embodiments of the present disclosure.

FIG. 3A is an embodiment of a timing diagram 300 for illustrating a sampling, e.g., reading, accessing, etc., of four variables VR1, VR2, VR3, and VR4 in synchronization with a clock signal. The variable VR1 is represented as an SDI signal 304, the variable VR2 is represented as an SDI signal 306, the variable VR3 is represented as an SDI signal 308, and the variable VR4 is represented as an SDI signal 310. An example of the variables VR1 thru VR4 includes frequency, power, real portion of load impedance, and imaginary portion of load impedance. Another example of the variables VR1 thru VR4 includes frequency, voltage magnitude, current magnitude, and phase between the voltage and current. Yet another example of the variables VR1 thru VR4 includes frequency, delivered power magnitude, and complex gamma. Another example of the variables VR1 thru VR4 includes frequency, delivered power magnitude, and complex load impedance. Another example of the variables VR1 thru VR4 includes frequency and complex forward power, which includes a voltage magnitude, a current magnitude, and a phase between the voltage and current. Yet another example of the variables VR1 thru VR4 includes frequency and complex reflected power, which includes a voltage magnitude, a current magnitude, and a phase between the voltage and current. Another example of the variables VR1 thru VR4 includes frequency and complex V&I, which includes a current magnitude, a voltage magnitude, and a phase between the current and voltage.

In several embodiments, the variables VR1 thru VR4 are communicated between a PSPI of the VMAP controller 208 and a PSPI of an RF generator controller. For example, the four variables VR1 thru VR4 are communicated between the PSPI 210 (FIG. 2A) and the PSPI 203 (FIG. 2A) via the communication channels C1, C3, C5, and C6 and/or via the communication channels C2, C4, C5, and C6. Moreover, as another example, the four variables VR1 thru VR4 are communicated between the PSPI 212 (FIG. 2A) and the PSPI 205 (FIG. 2A) via the communication channels C10, C12, C14, and C15 and/or via the communication channels C11, C13, C14, and C15.

The clock signal 302 is an example of the clock signal sent from an RF Ctrl-CLK port of a PSPI. For example the clock signal 302 is sent from the RF Ctrl-CLK port of the PSPI 210 (FIG. 2A). As another example, the clock signal 302 is sent from the RF Ctrl-CLK port of the PSPI 212 (FIG. 2A).

In some embodiments, a PSPI of the VMAP controller 208 samples the SDI signals 304, 306, 308, and 310 at a rising edge of each clock cycle of the clock signal 302. For example, bits of the SDI signals 304, 306, 308, and 310 are sampled at the 2 MHz-power read back SDI port, the 2 MHz-frequency read back SDI port, the 2 MHz-Z real-SDI port, and the 2 MHz-Z imaginary-SDI port of the PSPI 210 (FIG. 2A) during a rising edge 312 of one clock cycle of the clock signal 302 and other bits of the SDI signals 304, 306, 308, and 310 are sampled during a following rising edge 314 of a clock cycle of the clock signal 302. In some embodiments, instead of sampling bits of the SDI signals 304, 306, 308, and 310 at the rising edge 312, a PSPI of the VMAP controller 208 samples the bits SDI signals 304, 306, 308, and 310 at a falling edge of each clock cycle of the clock signal 302.

In some embodiments, a PSPI of an RF controller sends bits of the SDI signals 304, 306, 308, and 310 at a rising edge of each clock cycle of the clock signal 302. For example, bits of the SDI signals 304, 306, 308, and 310 are sent from the 2 MHz-power read back SDO port, the 2 MHz-frequency read back SDO port, the 2 MHz-Z real read back-SDO port, and the 2 MHz-Z imaginary read back-SDO port of the PSPI 203 (FIG. 2A) during the rising edge 312 of one clock cycle of the clock signal 302. In some embodiments, instead of sending bits of the SDI signals 304, 306, 308, and 310 at the rising edge 312, the PSPI 203 the SDI signals 304, 306, 308, and 310 at a falling edge of each clock cycle of the clock signal 302.

The sampling or sending of the SDI signals 304, 306, 308, and 310 in synchronization with, e.g., simultaneously with, etc., with the clock signal 302 is more efficient than a sampling or sending of one variable with a clock signal.

In various embodiments, during a falling edge of a clock cycle of the clock signal 302, a bit, e.g., a bit B1, a bit B2, a bit B3, etc. of a variable is set, e.g., sent, etc., by a PSPI fitted within the RF controller 252 (FIG. 2B) and during a rising edge of the clock cycle, the bit is latched, e.g., read, etc., by a PSPI of the host system 102. For example, during a falling edge of a clock cycle of the clock signal 302, a bit of a variable is set by a port of the PSPI 203 (FIG. 2A) and during a rising edge of the clock cycle, the bit is latched by a port of the PSPI 210.

In several embodiments, during a rising edge of a clock cycle of the clock signal 302, a bit of a variable is set by a port of a PSPI fitted within the RF controller 252 (FIG. 2B) and during a falling edge of the clock cycle, the bit is latched by a port of a PSPI of the host system 102.

In some embodiments, during a preceding edge, e.g., rising edge, falling edge, etc., of a clock cycle of the clock signal 302, a bit of a set point is set, e.g., sent, etc., by a PSPI fitted within the host system 102 (FIG. 2A) and during a next edge, e.g., falling edge, rising edge, etc., the bit is latched by a PSPI of the RF controller 252. For example, during a falling edge of a clock cycle of the clock signal 302, a bit of a variable is set by a port of the PSPI 210 (FIG. 2A) and during a rising edge of the clock cycle, the bit is latched by a port of the PSPI 203. The preceding edge precedes the next edge.

It should be noted that although FIG. 3A is described using SDI signals 304, 306, 308, and 310, in some embodiments, SDO signals that are communicated via the channels C2, C4, C11, and C13 (FIG. 1) are sampled using the clock signal 302.

It should further be noted that although four variables are illustrated in FIG. 3A, in several embodiments, any other number of variables, e.g., three, five, six, etc., may be used.

Moreover, in some embodiments, each variable is an n-bit variable, where n is an integer, e.g., 12, 13, 14, etc. In various embodiments, a frequency of transfer of data of a variable is a fraction, e.g., half, third, fourth, etc., of a clock frequency of the clock signal 302. For example, for every two clock pulses of the clock signal 302, a data bit of a variable is transferred. As another example, to transfer 13 bits of data of a variable, 26 clock pulses, e.g., edges, etc., are used. One clock edge to set a data bit and another clock edge to latch the data bit. In several embodiments, the clock signal 302 is a 1 MHz clock signal, a 2 MHz clock signal, etc. In various embodiments, the clock signal 302 has a frequency less than 500 MHz.

Figure 3B:
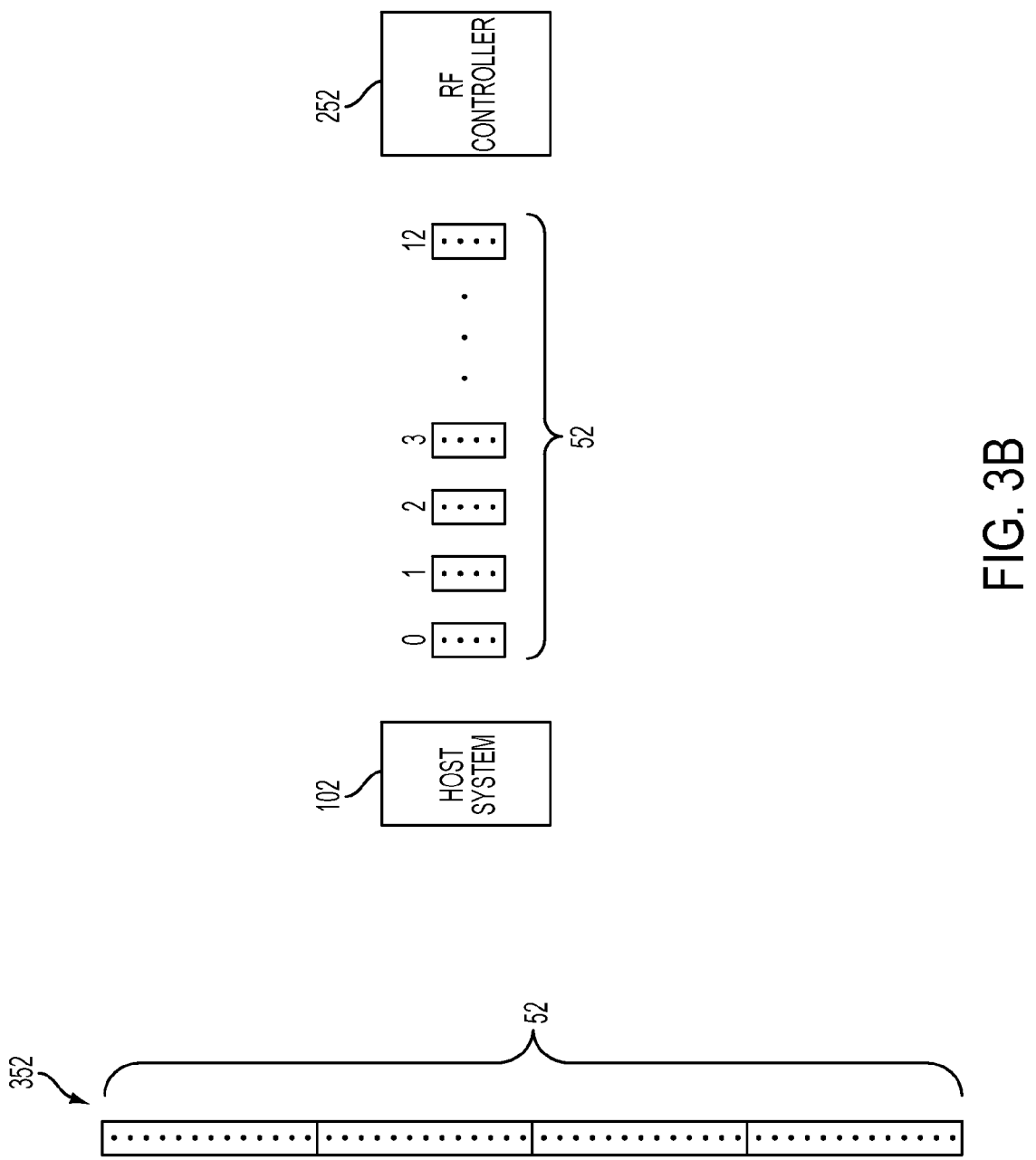
FIG. 3B is a diagram illustrating a difference between parallel transfer of data and parallel serial parallel transfer of data, in accordance with some embodiments of the present disclosure.

FIG. 3B is a diagram illustrating a difference between a full parallel transfer of data and a PSP transfer of data. As shown in a parallel chain 352, data is fully transferred in parallel, with each bit of data sent over a different communication channel. For example, when a variable has 13 bits and four variables are to be transferred between the host system 102 and the RF controller 252, it takes 52 communication channels to transfer the four variables VR1 thru VR4 between the host system 102 and the RF controller 252. This full parallel transfer adds real estate, e.g., semiconductor chip surface area, ports, etc., on the host system 102 and the RF controller 252, and also adds real estate, e.g., wires, etc., between the host system 102 and the RF controller 252. Also, the full parallel transfer adds to noise, loss of signal integrity, etc. of signals transferred over the parallel chain 352. When 52 bits of the four variables VR1 thru VR4 are transferred at a time, e.g., at a single clock edge, etc., from the RF generator 252 to the host system 102, a full parallel data set is transferred.

Comparatively, when the four variables are sent with less than 52 bits at a time, e.g., with 4 bits at a clock edge, etc., over communication channels, a less number of channels is used than that used in the full parallel transfer. For example, four channels are used to transfer four bits at a time. In the full parallel transfer, 52 channels are used to transfer 52 bits at a time. The reduced number of communication channels reduces real estate used on the host system 102 and on the RF controller 252 and also reduces real estate between the host system 102 and the RF controller 252. Also, the reduced number of communication channels reduces chances of loss of signal integrity, chances of noise, etc., of signals in the communication channels.

It should be noted that bits of variables, e.g., the variables VR1 thru VR4, are sampled for 13 times to capture all the 52 bits of the variables VR1 thru VR4 when the variables VR1 thru VR4 are transferred over four communication channels. For example, four bits, one bit of each variable, is sampled at a clock edge, and four bits are sampled for 13 times at 13 clock edges to sample 52 bits. When the four bits are sampled at a clock edge, data sampled is less than the 52 bits, which is the full parallel data set that includes the variables VR1 thru VR4.

It should further be noted that the numbers used herein, e.g., 13, 52, etc., are meant for illustration purposes only and should not be understood as limiting. For example, instead of 13, another number, e.g., 10, 11, 12, 14, 15, 16, etc., may be used.

Figure 4A:
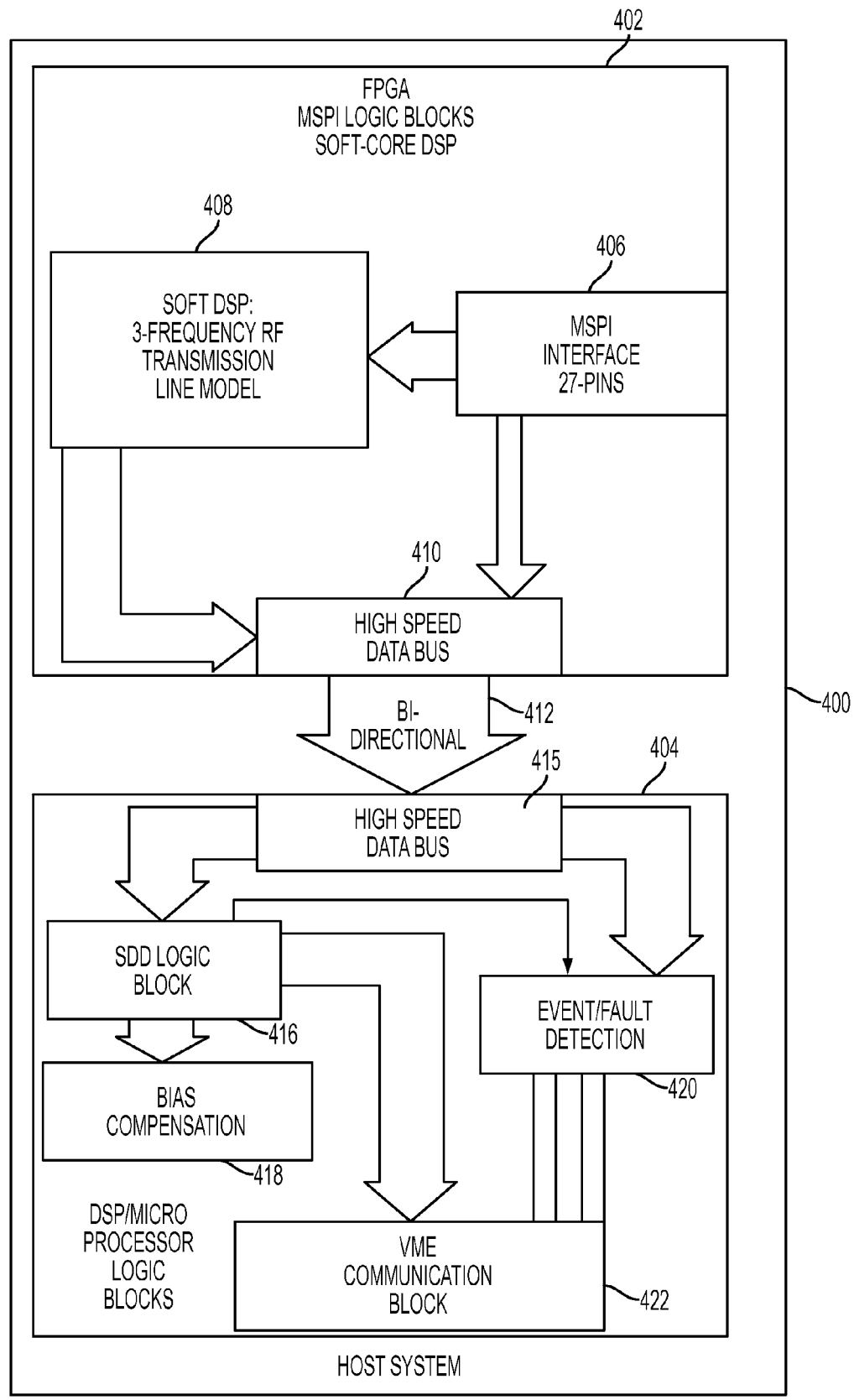
FIG. 4A is a block diagram of an embodiment of a host system, in accordance with various embodiments of the present disclosure.

FIG. 4A is a block diagram of an embodiment of a host system 400, which is an example of the host system 102 (FIGS. 1 and 2). The host system 400 includes an FPGA 402 and a microprocessor 404. It should be noted that instead of the FPGA 402, any other integrated circuit, e.g., ASIC, etc., may be used. Moreover, instead of the microprocessor 404, any other integrated circuit, e.g., FPGA, ASIC, etc., may be used.

The FPGA 402 includes a multiple SPI (MSPI) 406, which is also referred to herein as a PSPI. The MSPI 406 includes 27 pins, which includes 9 pins each for a PSPI. For example, the MSPI 406 includes the PSPI 210, the PSPI 212, and the PSPI 214 (FIG. 2A). The MSPI 406 receives data, e.g., power read back from an SDO port, frequency read back from an SDO port, real portion of load impedance read back from an SDO port, imaginary portion of load impedance read back from an SDO port, variables, etc., from the PSPIs 203, 205, and 206 (FIG. 3A), and sends the data to a soft-core DSP 408 and/or to a high-speed port 410.

The soft-core DSP 408 includes an RF transmission model, which is a computer-generated model of the RF transmission line 130 (FIG. 1). For example, the FPGA 402 implements an electrical circuit that includes elements, which are electrical components, e.g., capacitors, inductors, etc., of the RF transmission line 130. To illustrate, when the RF transmission line 130 includes an inductor having an inductance of L Henry and a capacitor having a capacitance of C Farad, the soft-core DSP 408 includes an inductor having an inductance of L Henry and a capacitor having a capacitance of C Farad. Moreover, the FPGA 402 connects the elements within the electrical circuit in the same manner, e.g., serial, parallel, etc., as that in which the electrical components are connected. For example, when an inductor is connected in parallel with a capacitor within the RF transmission line 130, the soft-core DSP 408 includes an inductor connected in parallel with a capacitor.

In some embodiments, instead of the RF transmission model, an impedance matching model or a combination of the impedance matching model and the RF transmission model are included within the soft-core DSP 408. The impedance matching model is implemented within the FPGA 402 based on the impedance matching circuit 120 (FIG. 1) in a similar manner as that of generating the RF transmission model from the RF transmission line 130.

The variables received by the MSPI 406 are sent from the MSPI 406 via the high-speed port 410 and a high-speed bus 412 to a high-speed bus port 415 of the microprocessor 404. Examples of a high-speed bus include a bus that transfers data at 500 MHz, at 400 MHz, at 300 MHz, at 600 MHz, between 5 MHz and 500 MHz, etc. The variables are communicated via the high-speed port 415 to an SDD logic block 416. A logic block is a computer program that is executed by one or more processors, e.g., the SDD logic block 416 is executed by the microprocessor 404. In several embodiments, a logic block is implemented within an integrated circuit.

The SDD logic block 416 applies a statistical transformation over a time window, e.g., 2 microseconds, 10 seconds, 5 seconds, 5 microseconds, etc., to variables received via the high-speed port 415 to generate statistical data. For example, the SDD logic block 416 generates a mean, rolling variance, median, mode, standard deviation, maximum, minimum, interquartile range (IQR), etc., from variables received via the high-speed port 415 to generate statistical data. To illustrate, the SDD logic block 416 generates a mean of multiple values of power received via the communication channel C10. In this illustration, the multiple values of power are received over a time window of ten microseconds. As another illustration, the SDD logic block 416 generates a median of multiple values of real portion of load impedance received via the communication channel C5. In this illustration, the multiple values of load impedance are received over a time window of five microseconds.

As another illustration, a first weight is assigned to a first variance of a first variable value, e.g., power magnitude, phase, etc., received in a first time window. In this example, a second weight is assigned to a second variance of a second variable value received within the first time window, and so on until an Nth weight is assigned to an Nth variance of an Nth variable value received within the first time window, where N is an integer greater than zero. Furthermore, in this illustration, a first rolling variance for the first time window is determined as a sum of a first product of the first weight and the first variance, a second product of the second weight and the second variance, and so on until an $N^{th}$ product of the $N^{th}$ weight and the Nth variance. It should be noted that in this illustration, the reception of an N−1th variable value by a PSPI of the host system 102 from a PSPI of the RF controller 252 precedes reception of the Nth value by the PSPI of the host system 102 from the PSPI of the RF controller 252. Similarly, a second rolling variance for a second time window is determined as a sum of an $(N-M)^{th}$ product of an $(N-M)^{th}$ weight and an $(N-M)^{th}$ variance and so on until an $(N+P)^{th}$ product of an $(N+P)^{th}$ weight and an $(N+P)^{th}$ variance, where P is an integer greater than zero. Also, in this illustration, the second time window overlaps the first time window. Various other examples of determining statistical data to perform SDD are described in U.S. Provisional Patent Application No. 61/737,623, filed on Dec. 14, 2012, titled "METHODS FOR COMPUTATION OF STATISTICS FOR STATISTICAL DATA DECIMATION", which is incorporated by reference herein in its entirety.

In a number of embodiments, the SDD logic block 416 deletes any values of a variable received over the time window except for a statistical value of the variable. For example, the SDD logic block 416 erases, from a storage device, within the host system 400, values of imaginary portion of load impedance except for a median of the values. As another example, the SDD logic block 416 erases, from a storage device, within the host system 400, values of frequency except for a mode of the values. As yet another example, after the first rolling variance is determined, the first thru N−M−1 variable values are deleted from one or more storage devices of the host system 400, where M is an integer less than N. As another example, the first rolling variance may be deleted from one or more storage devices after the second rolling variance is determined. In some embodiments, no decimation is performed in the host system 102 (FIGS. 1 and 2). In these embodiments, all values of a variable are stored within one or more storage devices of the host system 102, within a virtual machine, etc.

A bias compensation module 418 determines an amount of bias based on the statistical data to compensate for the bias. For example, upon determining that the statistical value is outside a pre-determined range, the bias compensation module 418 adjusts the statistical value to be within the range.

In some embodiments, the bias compensation module 418 determines a power and frequency based on the adjusted statistical value and provides the power and frequency via the high-speed port 415, the high-speed bus 412, the high-speed port 410, the MSPI 406, and the communication channels, e.g., C2, C4, C11, C13, etc. (FIG. 2A), used to transfer set points to the RF controllers 202, 204, and 206 (FIG. 2A) for real time control of the system 100 (FIG. 1). In various embodiments, the bias compensation module 418 provides the power and frequency based on the adjusted statistical value via the VME communication block 422 to a port, e.g., an Ethernet port, an EtherCAT port, a USB port, a parallel port, a serial port, etc., of an RF generator.

The microprocessor 404 includes an event/fault detection module 420 that detects an event, e.g., a fault, within the system 100 (FIG. 1), e.g., the plasma chamber 128, the impedance matching circuit 120, the RF transmission line 130, the RF generators 108, 112, 116, etc., in real time. For example, upon determining that the statistical value is outside a pre-determined range, the event/fault detection module 420 determines that an event has occurred within the system 100. An indication of the occurrence of the event is sent from the event/fault detection module 420 via a VME communication block 422, e.g., an Ethernet communication block, an EtherCAT communication block, a USB port, a network interface controller, a serial port, a parallel port, the 2 MHz Tx/Rx, the 27 MHz Tx/Rx, the 60 MHz Tx/Rx (FIG. 1), etc., to one or more devices, e.g., the RF generator 108, the RF generator 112, the RF generator 116, a remote computer system, etc. Examples of the remote computer system include a computer, a server, a processor, a cell phone, a smart phone, a tablet, etc., which is operated by a user. The user views the indication on a display device, e.g., a cathode ray tube display, a liquid crystal display device, a light emitting diode display device, a plasma display device, etc., of the remote computer system and may decide to take action to resolve the fault.

Figure 4B:
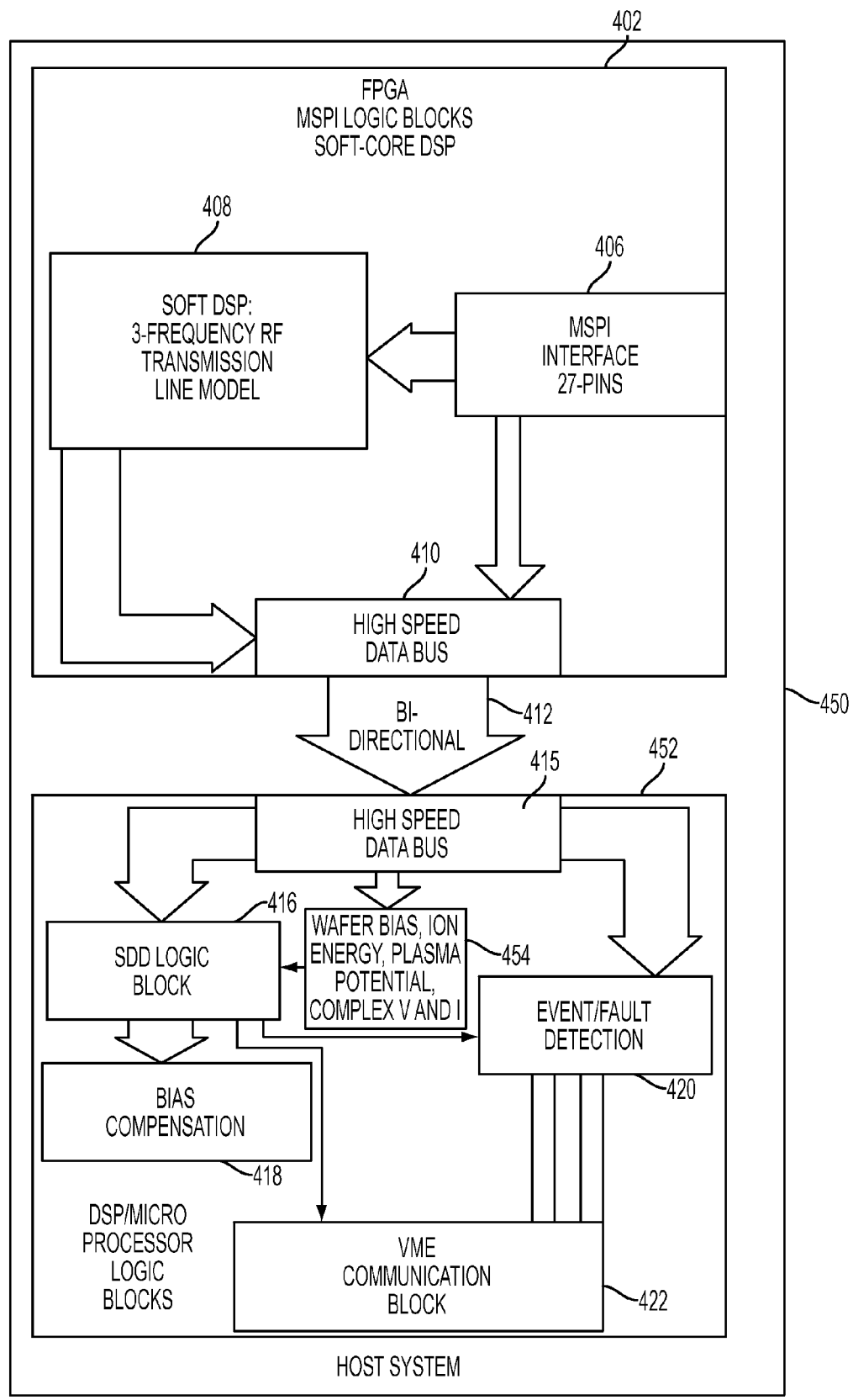
FIG. 4B is a block diagram of an embodiment of a host system, in accordance with several embodiments of the present disclosure.

FIG. 4B is a block diagram of an embodiment of a host system 450, which is another example of the host system 102 (FIG. 1). The host system 450 is similar to the host system 400 (FIG. 4A) except that the host system 450 includes a microprocessor 452. The microprocessor 452 is similar to the microprocessor 404 (FIG. 4A) except that the microprocessor 452 includes a variable module 454.

The variable module 454 receives the RF transmission model via the high-speed port 410, the high-speed bus 412, and the high-speed port 415, and receives the variables, e.g., load impedance, complex V&I, complex voltage, complex current, etc., from the MSPI 406 via the high-speed port 410, the high-speed bus 412, and the high-speed port 415. The variable module 454 determines variables, e.g., complex V&I, complex voltage, wafer bias, ion energy, plasma potential, complex current, load impedance, etc., at an output of the soft-core DSP 408 based on variables received from the MSPI 406 and characteristics, e.g., capacitance, impedance, etc., of the RF transmission model. For example, when load imped-ance received via the communication channels C5 and C6 (FIG. 2A) is Z1 and an impedance of elements of the RF transmission model is Z2, the variable module 454 determines an impedance at an output of the RF transmission model to be a directional sum of Z1 and Z2. As another example, when a complex V&I received via three communication channels is complex V&I1 and a complex V&I of the RF transmission model is complex V&I2, the variable module 454 determines a complex V&I at an output of the RF transmission model to be a directional sum of V&I1 and V&I2.

The SDD logic block 416 receives the variables from the variable module 454 and determines a statistical value over the time window from the variables in a manner similar to that explained above. Moreover, the bias compensation module 418 receives the statistical value from the SDD logic block 416 and determines a bias to apply to the plasma chamber 128 (FIG. 1) based on the statistical value. For example, upon determining that the statistical value is outside a pre-determined threshold, the bias compensation module 418 adjusts the statistical value to be within the threshold. The bias compensation module 418 sends power and frequency derived from the adjusted statistical value in a similar manner as that described above to one or more PSPIs of one or more RF generator controllers 202, 204, and 206 (FIG. 2A). For example, the bias compensation module 418 determines a power and frequency based on the adjusted statistical value and provides the power and frequency via the high-speed port 415, the high-speed bus 412, the high-speed port 410, the MSPI 406, and the communication channels, e.g., C2, C4, etc., to the RF controller 202. As another example, the bias compensation module 418 provides the power and frequency based on the adjusted statistical value via the VME communication block 422 to a port, e.g., an Ethernet port, an EtherCAT port, a USB port, a parallel port, a serial port, etc., of an RF generator.

The event/fault detection module 420 detects an event within the system 100 (FIG. 1) based on the statistical value received from the SDD logic block 416. For example, upon determining that the statistical value is outside a pre-determined threshold, the event/fault detection module 420 determines that an event has occurred within the system 100. An indication of the occurrence of the event is sent from the event/fault detection module 420 via a VME communication block 422 to one or more devices, e.g., the remote computer system, the RF generator 202, the RF generator 204, the RF generator 206 (FIG. 2A), etc. The user views the indication on the display device of the remote computer system and may decide to take action to resolve the fault.

Figure 5:
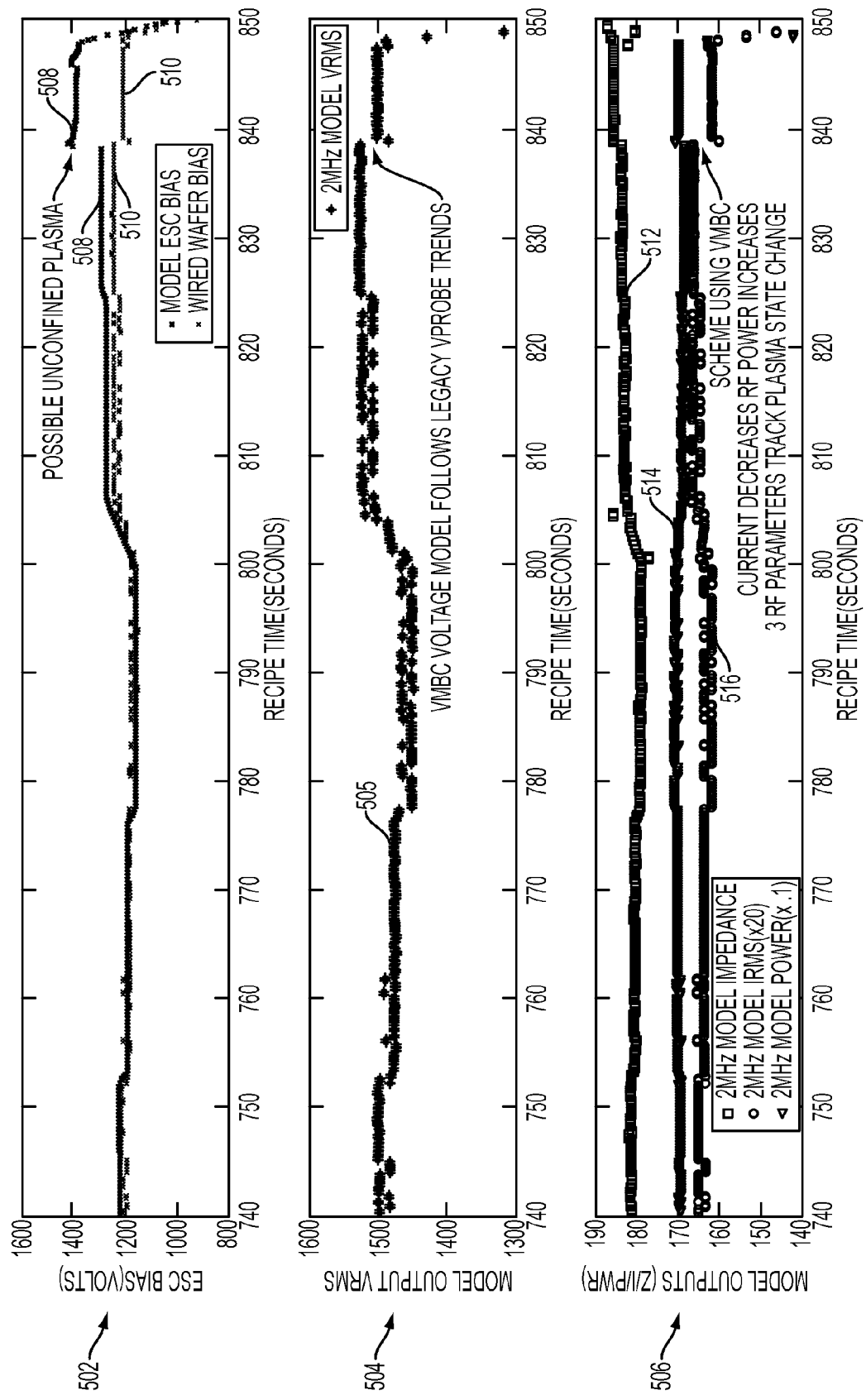
FIG. 5 is a diagram of embodiments of graphs used to illustrate that the variables help in determining an event of plasma within a plasma chamber of the system of FIG. 1, in accordance with several embodiments of the present disclosure.

FIG. 5 is a diagram of embodiments of graphs 502, 504, and 506 used to illustrate that the variables help in determining an event, e.g., unconfinement of plasma within the plasma chamber 128 (FIG. 1). Examples of other events include arcing, change in load impedance, change in health of plasma chamber 128, etc.

The graph 502 plots a wafer bias, which is bias at the ESC, versus time. The graph 502 includes a plot 508 of wafer bias determined based on a model, e.g., the RF transmission model, the impedance matching model, etc. Moreover, the graph 502 includes a plot 510 of wafer bias measured by a sensor. It should be noted that a potential plasma unconfinement is visible in the graph 502 at points of discontinuity within plots 508 and 510.

The graph 504 plots a root mean square (RMS) voltage determined at an output of a model versus time when the 2 MHz RF generator 108 (FIG. 1) is operational, e.g., powered on, etc., and the remaining RF generators, e.g., the 27 MHz RF generator 112 (FIG. 1), the 60 MHz RF generator 116 (FIG. 1), etc., are nonoperational, e.g., powered off. It is visible in the graph 504 from a discontinuity in a plot 505 that there is a potential plasma unconfinement.

The graph 506 plots a magnitude of impedance at the output of the soft-core DSP 408 (FIG. 4A), plots a magnitude, e.g., root mean square, etc., of complex current, and plots a magnitude of power versus time. The graph 506 includes a plot 512, which plots the magnitude of impedance at the output of the soft-core DSP 408 versus time. The graph 506 further includes a plot 514, which plots the magnitude of complex current determined at an output of the soft-core DSP 408 versus time. Moreover, the graph 506 includes a plot 516, which plots the magnitude of power determined at an output of the soft-core DSP 408 versus time. Based on a change in three RF parameters, e.g., a decrease in the current magnitude, an increase in the power magnitude, and an increase in the magnitude of impedance at the output of the soft-core DSP 408, it is determined that there is an occurrence of an event, e.g., plasma unconfinement. The event occurs at a time the three RF parameters change in the manner illustrated above.

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the RF generator 108 and the RF generator 112 are coupled to an inductor within the ICP plasma chamber.

It should be noted that although the above-described embodiments relate to providing an RF signal to the lower electrode of the ESC and grounding the upper electrode, in several embodiments, the RF signal is provided to the upper electrode while the lower electrode of the ESC is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those using physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer-readable code on a non-transitory computer-readable medium, e.g., a storage device. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A bus interconnect for interfacing a host system to a radio frequency (RF) generator that is coupled to a plasma chamber, comprising:
a plurality of host ports, wherein a first and a second port of the host system are used to provide a power component setting and a frequency component setting to the RF generator, and third, fourth, fifth, and sixth ports of the host system are used to receive four distinct variables that change over time, and a seventh port of the host system is used to provide a clock signal to the RF generator;
a plurality of generator ports used to send a power read back value and a frequency read back value to the host system;
a sampler circuit integrated with the host system, the sampler circuit configured to sample signals at the third, fourth, fifth, and sixth ports of the host system at selected clock edges defined by the clock signal to capture operating state data of the RF generator and the plasma chamber; and
a plurality of communication channels connecting the plurality of host ports with the plurality of generator ports, the plurality of communication channels including,
a first channel connecting the first port of the host system to a first port of the RF generator for facilitating a transfer of the power component setting from the first port of the host system to the first port of the RF generator;
a second channel connecting the second port of the host system to a second port of the RF generator for facilitating a transfer of the frequency component setting from the second port of the host system to the second port of the RF generator;
a third channel connecting the third port of the host system to a third port of the RF generator for facilitating a transfer of the power read back value from the third port of the RF generator to the third port of the host system;

a fourth channel connecting the fourth port of the host system to a fourth port of the RF generator for facilitating a transfer of the frequency read back value from the fourth port of the RF generator to the fourth port of the host system;

a fifth channel connecting the fifth port of the host system to a fifth port of the RF generator for facilitating a transfer of a first portion of the operating state data from the fifth port of the RF generator to the fifth port of the host system;

a sixth channel connecting the sixth port of the host system to a sixth port of the RF generator for facilitating a transfer of a second portion of the operating state data from the sixth port of the generator to the sixth port of the host system;

a seventh channel for facilitating a transfer of the clock signal from the seventh port of the host system to a seventh port of the RF generator to synchronize operation of the RF generator with the host system, wherein the transfer of the power component setting, the frequency component setting, and the clock signal facilitates generation of an RF electrical signal by the RF generator that is coupled to the plasma chamber.

2. The bus interconnect of claim 1, wherein the signals sampled at the third, fourth, fifth, and sixth ports of the host system are resampled a set number of times to capture a full parallel data set.

3. The bus interconnect of claim 1, wherein the signals sampled at a clock edge are less than a full parallel data set.

4. The bus interconnect of claim 1, wherein an eighth port of the host system is used to provide a slave select signal to select the RF generator for providing data to or reading data from the RF generator wherein a ninth port of the host system is used to communicate a ground signal with the RF generator.

5. The bus interconnect of claim 1, wherein the first port of the host system is a power set point serial data out port, wherein the second port of the host system is a frequency set point serial data out port, wherein the third port of the host system is a power read back serial data in port, wherein the fourth port of the host system is a frequency read back serial data in port, wherein the fifth port of the host system is a real portion of load impedance serial data in port, and wherein the sixth port of the host system is an imaginary portion of load impedance serial data in port.

6. The bus interconnect of claim 1, wherein the power component setting includes a power magnitude and the frequency component setting includes a frequency value.

7. The bus interconnect of claim 1, wherein the variables include:
frequency, power, real portion of load impedance, and imaginary portion of load impedance; or
frequency, voltage magnitude, current magnitude, and phase between the voltage and current; or
frequency, delivered power magnitude, and complex gamma; or
frequency, delivered power magnitude, and complex load impedance; or
frequency and complex forward power; or
frequency and complex reflected power; or
frequency and complex voltage and current.

8. The bus interconnect of claim 1, wherein the power read back value includes a power magnitude and the frequency read back value includes a frequency magnitude.

9. The bus interconnect of claim 1, wherein the sampler circuit is located within the host system.

10. The bus interconnect of claim 1, wherein the selected clock edges include rising clock edges or falling clock edges.

11. The bus interconnect of claim 1, wherein a bit of a signal of one of the variables is set during a falling clock edge and is latched during a rising clock edge.

12. The bus interconnect of claim 1, wherein the operating state data includes data indicating whether there is plasma unconfinement within the plasma chamber, data indicating whether there is arcing within the plasma chamber, or a combination thereof.

13. The bus interconnect of claim 1, wherein the operating state data is detected by a sensor of the RF generator.

14. A bus interconnect for interfacing a host system to a radio frequency (RF) generator that is coupled to a plasma chamber, comprising:
a plurality of host ports, wherein a first and a second port of the host system are used to provide a power component setting and a frequency component setting to the RF generator, and third, fourth, fifth, and sixth ports of the host system are used to receive four distinct variables that change over time;
a plurality of generator ports, wherein a first and a second port of the RF generator are used to send a power read back value and a frequency read back value to the host system; and
a sampler circuit integrated with the host system, the sampler circuit configured to sample signals at the third, fourth, fifth, and sixth ports of the host system at selected clock edges to capture operating state data of the RF generator and the plasma chamber; and
a plurality of communication channels connecting the RF generator and two additional RF generators with the host system, each RF generator coupled to the host system via nine communication channels.

15. A bus interconnect for interfacing a host system to a radio frequency (RF) generator that is coupled to a plasma chamber, comprising:
a first set of host ports, the first set of host ports used to provide a power component setting and a frequency component setting to the RF generator, and the first set of host ports used to receive distinct variables that change over time;
a second set of generator ports used to send a power read back value and a frequency read back value to the host system;
a sampler circuit integrated with the host system, the sampler circuit configured to sample signals at the ports of the first set at selected clock edges to capture operating state data of the RF generator and the plasma chamber; and
a plurality of communication channels connecting the first set of host ports with the second set of generator ports, the plurality of communication channels including,
a first channel connecting a first port of the first set of host ports to a first port of the second set of generator ports for facilitating a transfer of the power component setting from the first port of the first set of host ports to the first port of the second set of generator ports;
a second channel connecting a second port of the first set of host ports to a second port of the second set of generator ports for facilitating a transfer of the frequency component setting from the second port of the first set of host ports to the second port of the second set of generator ports;

a third channel connecting a third port of the first set of host ports to a third port of the second set of generator ports for facilitating a transfer of the power read back value from the third port of the first set of generator ports to the third port of the second set of host ports;

a fourth channel connecting a fourth port of the first set of host ports to a fourth port of the second set of generator ports for facilitating a transfer of the frequency read back value from the fourth port of the first set of generator ports to the fourth port of the second set of host ports;

wherein the transfer of the power component setting via the first channel and the frequency component setting via the second channel facilitates generation of an RF electrical signal by the RF generator that is coupled to the plasma chamber.

16. The bus interconnect of claim 15, wherein the signals sampled at the ports of the first set are resampled a set number of times to capture a full parallel data set.

17. The bus interconnect of claim 15, wherein the signals sampled at a clock edge are less than a full parallel data set.

18. The bus interconnect of claim 15, wherein the variables include:
frequency, power, real portion of load impedance, and imaginary portion of load impedance; or
frequency, voltage magnitude, current magnitude, and phase between the voltage and current; or
frequency, delivered power magnitude, and complex gamma; or
frequency, delivered power magnitude, and complex load impedance; or
frequency and complex forward power; or
frequency and complex reflected power; or
frequency and complex voltage and current; or
frequency, complex forward power, and complex reflected power; or
frequency, complex voltage, and complex current.

19. A plasma system comprising:
a host system for providing data signals;
a radio frequency (RF) generator coupled to the host system, the RF generator for generating an RF signal based on the data signals;
an impedance matching circuit for matching an impedance of the RF generator with an impedance of a plasma chamber;
an RF transmission line coupling the impedance matching circuit to the plasma chamber;
a bus interface connecting the host system to the RF generator, the bus interface including:
a first set of host ports, the first set of host ports used to provide a power component setting and a frequency component setting to the RF generator, and the first set of host ports used to receive distinct variables that change over time;
a second set of generator ports used to send a power read back value and a frequency read back value to the host system; and
a sampler circuit integrated with the host system, the sampler circuit configured to sample signals at the ports of the first set at selected clock edges to capture operating state data of the RF generator and the plasma chamber; and
a plurality of communication channels connecting the first set of host ports with second set of generator ports, the plurality of communication channels including,
a first channel connecting a first port of the first set of host ports to a first port of the second set of generator ports for facilitating a transfer of the power component setting from the first port of the first set of host ports to the first port of the second set of generator ports;
a second channel connecting a second port of the first set of host ports to a second port of the second set of generator ports for facilitating a transfer of the frequency component setting from the second port of the first set of host ports to the second port of the second set of generator ports;
a third channel connecting a third port of the first set of host ports to a third port of the second set of generator ports for facilitating a transfer of the power read back value from the third port of the first set of generator ports to the third port of the second set of host ports;
a fourth channel connecting a fourth port of the first set of host ports to a fourth port of the second set of generator ports for facilitating a transfer of the frequency read back value from the fourth port of the first set of generator ports to the fourth port of the second set of host ports;
wherein the transfer of the power component setting via the first channel and the frequency component setting via the second channel facilitates generation of an RF electrical signal by the RF generator that is coupled to the plasma chamber.

20. The plasma system of claim 19, wherein the signals sampled at the ports of the first set are resampled a set number of times to capture a full parallel data set.

21. The plasma system of claim 19, wherein the signals sampled at a clock edge are less than a full parallel data set.

22. The plasma system of claim 19, wherein the variables include:
frequency, power, real portion of load impedance, and imaginary portion of load impedance; or
frequency, voltage magnitude, current magnitude, and phase between the voltage and current; or
frequency, delivered power magnitude, and complex gamma; or
frequency, delivered power magnitude, and complex load impedance; or
frequency and complex forward power; or
frequency and complex reflected power; or
frequency and complex voltage and current; or
frequency, complex forward power, and complex reflected power; or
frequency, complex voltage, and complex current.

23. The plasma system of claim 19, wherein the host system includes a statistical data decimation module, the statistical data decimation module for calculating statistical data based on the variables, the statistical data decimation module for deleting variable data other than the statistical data.

* * * * *